United States Patent
Miyazawa et al.

(10) Patent No.: US 10,147,866 B2
(45) Date of Patent: Dec. 4, 2018

(54) PIEZOELECTRIC DRIVING DEVICE AND DRIVING METHOD THEREFOR, AND ROBOT AND DRIVING METHOD THEREFOR

(71) Applicant: Seiko Epson Corporation, Tokyo (JP)

(72) Inventors: Osamu Miyazawa, Shimosuwa (JP); Akio Konishi, Matsumoto (JP)

(73) Assignee: Seiko Epson Corporation (JP)

(*) Notice: Subject to any disclaimer, the term of this patent is extended or adjusted under 35 U.S.C. 154(b) by 493 days.

(21) Appl. No.: 14/824,308

(22) Filed: Aug. 12, 2015

(65) Prior Publication Data

US 2016/0049573 A1 Feb. 18, 2016

(30) Foreign Application Priority Data

Aug. 13, 2014 (JP) .................. 2014-164618
Aug. 13, 2014 (JP) .................. 2014-164619

(51) Int. Cl.
| | |
|---|---|
| B25J 9/12 | (2006.01) |
| H01L 41/04 | (2006.01) |
| H01L 41/09 | (2006.01) |
| H02N 2/00 | (2006.01) |
| H02N 2/10 | (2006.01) |
| B25J 17/00 | (2006.01) |

(Continued)

(52) U.S. Cl.
CPC ............ *H01L 41/042* (2013.01); *B25J 9/12* (2013.01); *B25J 17/00* (2013.01); *H01L 41/0472* (2013.01); *H01L 41/09* (2013.01); *H01L 41/0913* (2013.01); *H02N 2/004* (2013.01); *H02N 2/103* (2013.01); *H02P 25/027* (2013.01); *Y10S 901/28* (2013.01)

(58) Field of Classification Search
CPC ............ H01L 41/042; B25J 9/12; B25J 17/00
See application file for complete search history.

(56) References Cited

U.S. PATENT DOCUMENTS 5,696,421 A * 12/1997 Zumeris .................. H02N 2/103
                                                              310/323.02
5,956,529 A *  9/1999 Lee ....................... G02B 27/646
                                                              348/203

(Continued)

FOREIGN PATENT DOCUMENTS

| JP | 2002-043643 A | 2/2002 |
| JP | 2002-234156 A | 8/2002 |

(Continued)

OTHER PUBLICATIONS

Muralt et al., "Fabrication and Characterization of PZT Thin-Film Vibrators for Micormotors", Sensors and Actuators A, vol. 48, pp. 157-165 (1995).

(Continued)

*Primary Examiner* — David M Fenstermacher
(74) *Attorney, Agent, or Firm* — Harness, Dickey & Pierce, P.L.C.

(57) ABSTRACT

A piezoelectric driving device includes a vibrating plate and a piezoelectric vibrator provided on the vibrating plate. The piezoelectric vibrator has a first electrode, a second electrode, and a piezoelectric body located between the first electrode and the second electrode, and a thickness of the piezoelectric body is within a range from 50 nm to 20 µm.

8 Claims, 14 Drawing Sheets

(51) Int. Cl.
*H01L 41/047* (2006.01)
*H02P 25/02* (2016.01)

(56) References Cited

U.S. PATENT DOCUMENTS

| | | | |
|---|---|---|---|
| 6,064,140 A * | 5/2000 | Zumeris | G11B 7/08576 |
| | | | 310/316.01 |
| 6,384,514 B1 * | 5/2002 | Slutskiy | G11B 5/5552 |
| | | | 271/264 |
| 7,224,102 B2 | 5/2007 | Miyazawa | |
| 7,692,362 B2 | 4/2010 | Lee et al. | |
| 8,058,773 B2 * | 11/2011 | Kotani | H02N 2/003 |
| | | | 310/323.02 |
| 8,585,188 B2 | 11/2013 | Ohta | |
| 9,666,785 B2 * | 5/2017 | Iwazaki | H02P 25/32 |
| 9,757,857 B2 * | 9/2017 | Miyazawa | B25J 9/12 |
| 9,818,925 B2 * | 11/2017 | Maruyama | H01L 41/053 |
| 2002/0140320 A1 | 10/2002 | Unno et al. | |
| 2003/0201695 A1 | 10/2003 | Funakubo et al. | |
| 2005/0151442 A1 | 7/2005 | Kihara et al. | |
| 2006/0028100 A1 | 2/2006 | Unno et al. | |
| 2007/0138608 A1 | 6/2007 | Ikehashi | |
| 2007/0182281 A1 | 8/2007 | Mori | |
| 2009/0026887 A1 * | 1/2009 | Fujii | B41J 2/14233 |
| | | | 310/330 |
| 2010/0208007 A1 | 8/2010 | Nihei | |
| 2011/0291525 A1 | 12/2011 | Maruyama | |
| 2012/0153774 A1 | 6/2012 | Maruyama | |
| 2012/0248805 A1 | 10/2012 | Kamijo et al. | |
| 2013/0334932 A1 | 12/2013 | Maruyama et al. | |
| 2014/0159543 A1 | 6/2014 | Maruyama | |
| 2014/0176646 A1 | 6/2014 | Hirai et al. | |
| 2014/0368087 A1 | 12/2014 | Hiraoka et al. | |

FOREIGN PATENT DOCUMENTS

| | | |
|---|---|---|
| JP | 2003-179279 A | 6/2003 |
| JP | 2004-104984 A | 4/2004 |
| JP | 2004-320979 A | 11/2004 |
| JP | 2005-271191 A | 10/2005 |
| JP | 2007-167998 A | 7/2007 |
| JP | 2007-185056 A | 7/2007 |
| JP | 2008-227123 A | 9/2008 |
| JP | 2009-067025 A | 4/2009 |
| JP | 2009-174420 A | 8/2009 |
| JP | 2009-273303 A | 11/2009 |
| JP | 2010-192721 A | 9/2010 |
| JP | 2010-214634 A | 9/2010 |
| JP | 5153419 B2 | 2/2013 |
| JP | 2013-160891 A | 8/2013 |
| JP | 2014-079134 A | 5/2014 |
| JP | 2014-079135 A | 5/2014 |
| JP | 2014-121799 A | 7/2014 |
| WO | WO-2013-114857 A1 | 8/2013 |

OTHER PUBLICATIONS

Extended European Search Report for Patent Application No. EP15180534.8 dated Jan. 20, 2016 (9 pages).

K.G. Brooks et al., "Orientation of rapid thermally annealed lead zirconate titanate thin films on (111) Pt substrates" J. Mater. Res., vol. 9, No. 10, pp. 2540-2553 (Oct. 1994).

X.G. Tang et al., "Processing effects on the microstructure and ferroelectric properties of Pb(Zr,Ti)O3 thin films prepared by sol-gel process" Surface Coatings and Technology, vol. 161, pp. 169-173 (2002).

* cited by examiner

S110 ⇩ FORM INSULATING LAYER

S120 ⇩ FORM FIRST ELECTRODE

S130 ⇩ FORM PIEZOELECTRIC BODY LAYER

S140 ⇩ FORM SECOND ELECTRODE

S150 ⇩ PATTERN SECOND ELECTRODE AND PIEZOELECTRIC BODY

S160 ⇩ FORM AND PATTERN INSULATING LAYER

S170 ⇩ FORM AND PATTERN LEAD ELECTRODES

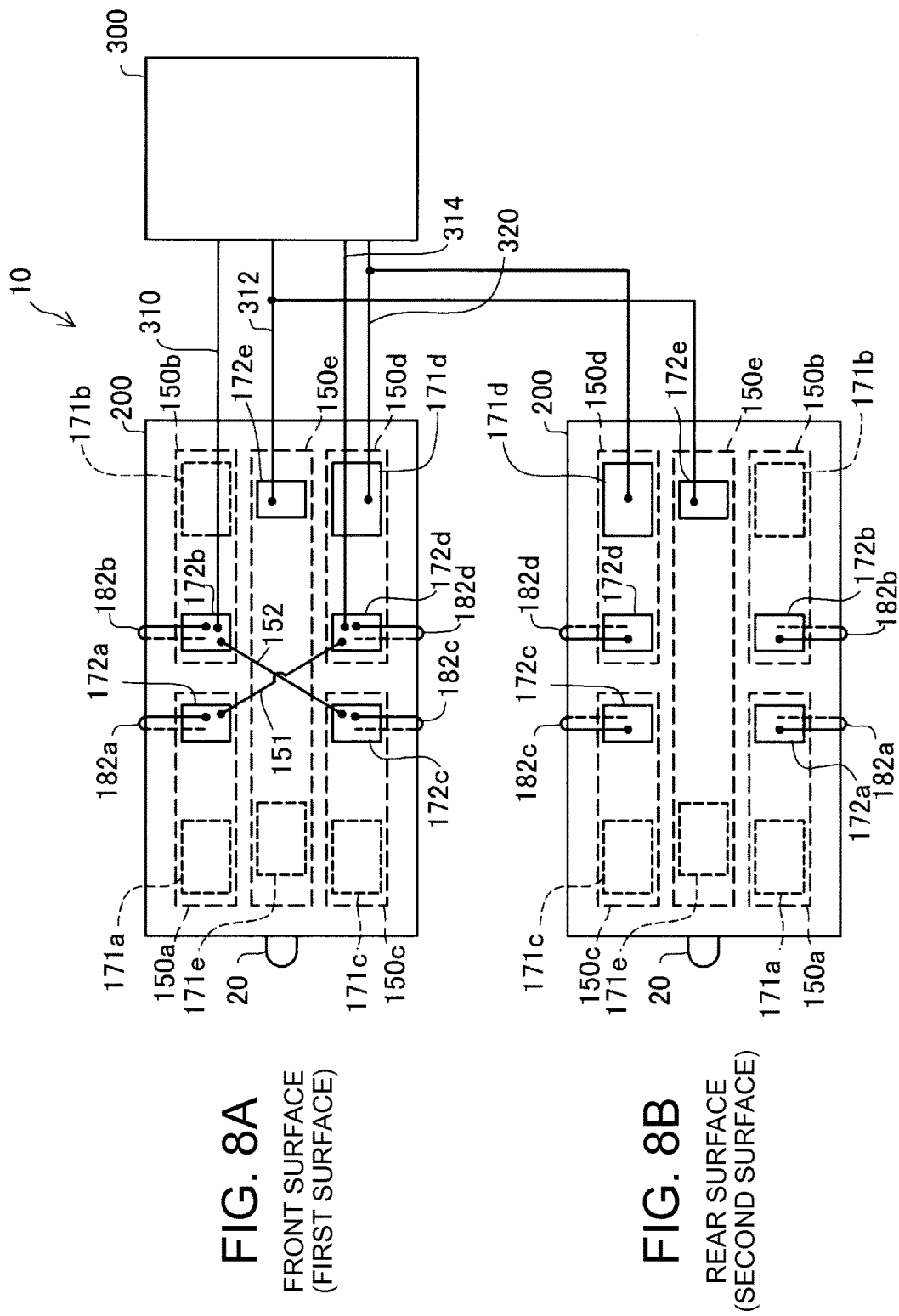

S510 ⇩

S520 ⇩

S530 ⇩

S540 ⇩

PIEZOELECTRIC DRIVING DEVICE AND DRIVING METHOD THEREFOR, AND ROBOT AND DRIVING METHOD THEREFOR

BACKGROUND

1. Technical Field

The present invention relates to a piezoelectric driving device and a driving method therefor, and a robot and a driving method therefor.

2. Related Art

Piezoelectric actuators (piezoelectric driving devices) that drive driven members by vibrating piezoelectric bodies require no magnets or coils and are used in various fields (e.g. Patent Document 1 (JP-A-2004-320979)). In the basic configuration of the piezoelectric driving device, four piezoelectric elements are arranged in two rows and two columns on each of two surfaces of a reinforcing plate, and a total of eight piezoelectric elements are provided on both sides of the reinforcing plate. Each of the individual piezoelectric elements is a unit in which a piezoelectric body is sandwiched by two electrodes and the reinforcing plate is also used as one electrode of the piezoelectric element. A projecting portion for rotating a rotor as a driven member is provided in contact with the rotor on one end of the reinforcing plate. When an alternating-current voltage is applied to the diagonally provided two piezoelectric elements of the four piezoelectric elements, the two piezoelectric elements expand and contract and the projecting portion of the reinforcing plate performs reciprocating motion or elliptical motion in response thereto. Then, in response to the reciprocating motion or elliptical motion of the projecting portion of the reinforcing plate, the rotor as the driven member rotates in a predetermined rotation direction. Further, the two piezoelectric elements to which the alternating-current voltage is applied are switched to the other two piezoelectric elements, and thereby, the rotor may be rotated in the opposite direction. Patent Document 2 (JP-A-2008-227123) discloses a manufacturing method for a piezoelectric vibrator having a piezoelectric body. The piezoelectric body manufactured by the manufacturing method is the so-called bulk piezoelectric body and its thickness is 0.15 mm (150 µm).

In the case where a piezoelectric driving device is housed and used in a small space (e.g. within a joint of a robot), the wiring space may be insufficient with a piezoelectric driving device using a piezoelectric body of related art, and there has been a demand for a thinner piezoelectric body. However, if the piezoelectric body is made too much thinner, the force generated in the piezoelectric element becomes extremely small and displacement necessary for driving of the driven member is not obtained, and thus, it is necessary to increase the mechanical quality factor Qm for increasing the displacement. Further, it is necessary to suppress heat generation for housing of the piezoelectric driving device in the small space, and it is necessary to reduce mechanical loss with vibrations by increasing the mechanical quality factor Qm. As described above, in related art, an appropriate configuration of the small piezoelectric driving device that can drive the driven member is not sufficiently studied.

SUMMARY

An advantage of some aspects of the invention is to solve at least a part of the problems described above, and the invention can be implemented as the following forms or application examples.

(1) An aspect of the invention provides a piezoelectric driving device. The piezoelectric driving device includes a vibrating plate, and a piezoelectric vibrator having a first electrode, a second electrode, and a piezoelectric body located between the first electrode and the second electrode and provided on the vibrating plate, wherein a thickness of the piezoelectric body is from 50 nm to 20 µm. According to this configuration, the thickness of the piezoelectric body is set to be from 50 nm (0.05 µm) to 20 µm, and the smaller piezoelectric driving device may be implemented.

(2) In the piezoelectric driving device according to the aspect, the thickness of the piezoelectric body may be from 400 nm to 20 µm. According to this configuration, the thickness of the piezoelectric body is set to 400 nm or more, a force generated in a piezoelectric element may be made larger.

(3) In the piezoelectric driving device according to the aspect, the piezoelectric vibrator may have a substrate, the first electrode formed on the substrate, the piezoelectric body formed on the first electrode, and the second electrode formed on the piezoelectric body, and the substrate may be bonded to the vibrating plate. In order to extract higher energy from the piezoelectric element, the mechanical quality factor Qm may be made larger so that a larger amplitude may be obtained in the resonance state. According to this configuration, the piezoelectric body, the first electrode, and the second electrode are formed on the substrate, and thereby, the value of the mechanical quality factor Qm of the piezoelectric driving device may be made larger than that of the case without the substrate.

(4) In the piezoelectric driving device according to the aspect, the substrate may be a silicon substrate. The value of the mechanical quality factor Qm of the piezoelectric body is several thousands and, in contrast, the value of the mechanical quality factor Qm of the silicon substrate is about a hundred thousand. Therefore, according to this configuration, the value of the mechanical quality factor Qm of the piezoelectric driving device may be made larger.

(5) In the piezoelectric driving device according to the aspect, the vibrating plate may have a first surface and a second surface, and the piezoelectric vibrators may be provided on the first surface and the second surface of the vibrating plate. According to this configuration, the piezoelectric elements are provided on the first surface and the second surface of the vibrating plate, and thereby, a driving force of the piezoelectric driving device may be made larger.

(6) In the piezoelectric driving device according to the aspect, the vibrating plate may include a projecting portion in contact with a driven member. According to this configuration, the projecting portion may push the driven member to drive the driven member.

(7) Another aspect of the invention provides a piezoelectric driving device. The piezoelectric driving device includes a vibrating plate and a piezoelectric vibrator provided on the vibrating plate, and the piezoelectric vibrator includes a substrate, a first electrode provided on the substrate, a piezoelectric body provided on the first electrode, and a second electrode provided on the piezoelectric body. According to this configuration, the piezoelectric vibrator includes the substrate, and, even when the piezoelectric body is made thinner, the mechanical strength and the mechanical quality factor Qm of the piezoelectric vibrator may be made larger. As a result, an appropriate configuration of the smaller piezoelectric driving device may be implemented.

(8) In the piezoelectric driving device according to the aspect, the piezoelectric vibrator may have an insulating layer on the second electrode and a first lead electrode connected to the first electrode and a second lead electrode connected to the second electrode on the insulating layer. According to this configuration, wiring to the first lead electrode, the second lead electrode may be provided and voltages may be applied from the first lead electrode, the second lead electrode. Compared to the case of direct wiring to the first electrode, the second electrode, no piezoelectric body exists under the position of the wiring connection, and electrostatic breakdown of the piezoelectric body or the like is harder to occur when the wiring is connected and leakage current of the piezoelectric body may be suppressed.

(9) In the piezoelectric driving device according to the aspect, the piezoelectric vibrator may be provided on the vibrating plate so that the second electrode and the vibrating plate may sandwich the piezoelectric body, the first electrode, and the substrate.

(10) In the piezoelectric driving device according to the aspect, the piezoelectric vibrator may be provided on the vibrating plate so that the substrate and the vibrating plate may sandwich the first electrode, the piezoelectric body, and the second electrode. In the piezoelectric vibrator, the substrate side may be in contact with the vibrating plate or the second electrode side may be in contact with the vibrating plate.

(11) In the piezoelectric driving device according to the aspect, the vibrating plate may have a wiring layer having a plurality of lines, the piezoelectric vibrator may have an insulating layer on the second electrode, the first lead electrode may be connected to the first line of the plurality of lines, and the second lead electrode may be connected to the second line of the plurality of lines. According to this configuration, wiring to the first line, the second line on the vibrating plate may be provided, and thereby, electrostatic breakdown of the piezoelectric body or the like is harder to occur when the wiring is connected and leakage current of the piezoelectric body may be suppressed.

(12) In the piezoelectric driving device according to the aspect, the substrate may be a silicon substrate. The value of the mechanical quality factor Qm of the piezoelectric body is several thousands and, in contrast, the value of the mechanical quality factor Qm of the silicon substrate is about a hundred thousand. Therefore, according to this configuration, the value of the mechanical quality factor Qm of the piezoelectric driving device may be made larger.

(13) In the piezoelectric driving device according to the aspect, a thickness of the substrate may be from 10 µm to 100 µm. When the thickness of the substrate is set to 10 µm or more, the substrate may be handled relatively easily in deposition processing on the substrate. Or, when the thickness of the substrate is set to 100 µm or less, the substrate may be vibrated easily in response to expansion and contraction of the piezoelectric body formed by a thin film.

(14) In the piezoelectric driving device according to the aspect, the thickness of the substrate may be from 50 nm to 20 µm. When the thickness of the piezoelectric body is set to 50 nm (0.05 µm) or more, a sufficiently large force may be generated in response to the expansion and contraction of the piezoelectric body. Or, when the thickness of the piezoelectric body is set to 20 µm or less, the piezoelectric driving device may be sufficiently downsized.

(15) In the piezoelectric driving device according to the aspect, the vibrating plate may have a first surface and a second surface, and the piezoelectric vibrators may be provided on the first surface and the second surface of the vibrating plate. According to this configuration, the piezoelectric elements are provided on the first surface and the second surface of the vibrating plate, and thereby, a driving force of the piezoelectric driving device may be made larger.

(16) In the piezoelectric driving device according to the aspect, the vibrating plate may include a projecting portion in contact with a driven member. According to this configuration, the projecting portion may push the driven member to drive the driven member.

(17) Still another aspect of the invention provides a robot. The robot includes a plurality of link parts, joint parts connecting the plurality of link parts, and the piezoelectric driving devices according to any one of the above described configurations, which rotate the plurality of link parts in the joint parts. According to this configuration, the piezoelectric driving device may be used for driving of the robot.

(18) Yet another aspect of the invention provides a driving method for a robot. The driving method includes driving the piezoelectric driving devices by applying periodically changing voltages between the first electrodes and the second electrodes of the piezoelectric driving devices to rotate the plurality of link parts in the joint parts.

(19) Still yet another aspect of the invention provides a driving method for the piezoelectric driving device. The driving method includes applying, between the first electrode and the second electrode, a periodically changing voltage which is an undulating voltage whose direction of an electric field applied to the piezoelectric body is a single direction from one electrode to the other electrode of the electrodes. According to this configuration, the voltage applied to the piezoelectric body is only in the single direction, and durability of the piezoelectric body may be improved.

The invention can be implemented in various aspects, and, for example, not only in the piezoelectric driving device but also in various aspects including a driving method for a piezoelectric driving device, a manufacturing method for a piezoelectric driving device, a robot including a piezoelectric driving device, a driving method for a robot including a piezoelectric driving device, a liquid delivery pump, and a chemical dosing pump.

BRIEF DESCRIPTION OF THE DRAWINGS

The invention will be described with reference to the accompanying drawings, wherein like numbers reference like elements.

FIGS. 8A and 8B are explanatory diagrams showing an example of wiring between the piezoelectric driving device and the drive circuit.

DESCRIPTION OF EXEMPLARY EMBODIMENTS

First Embodiment

Figure 1A:
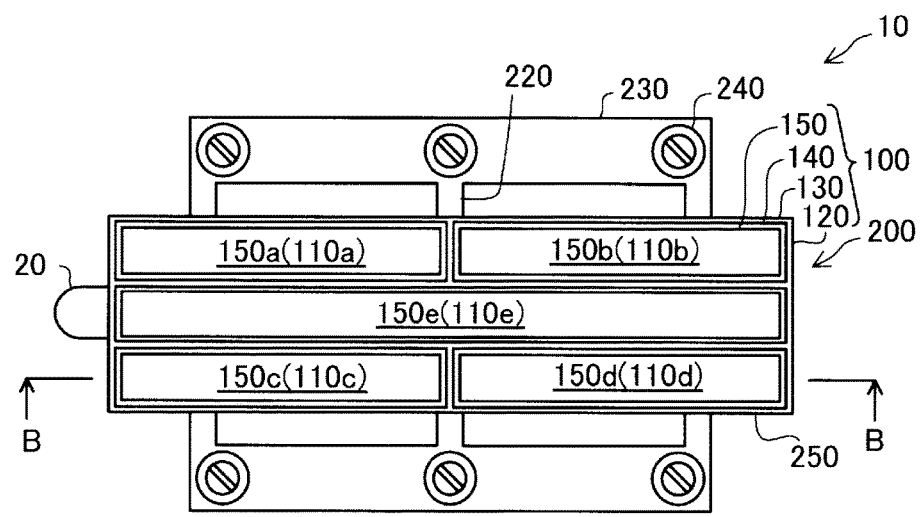
FIGS. 1A and 1B are a plan view and a sectional view showing a schematic configuration of a piezoelectric driving device of a first embodiment.
Figure 1B:
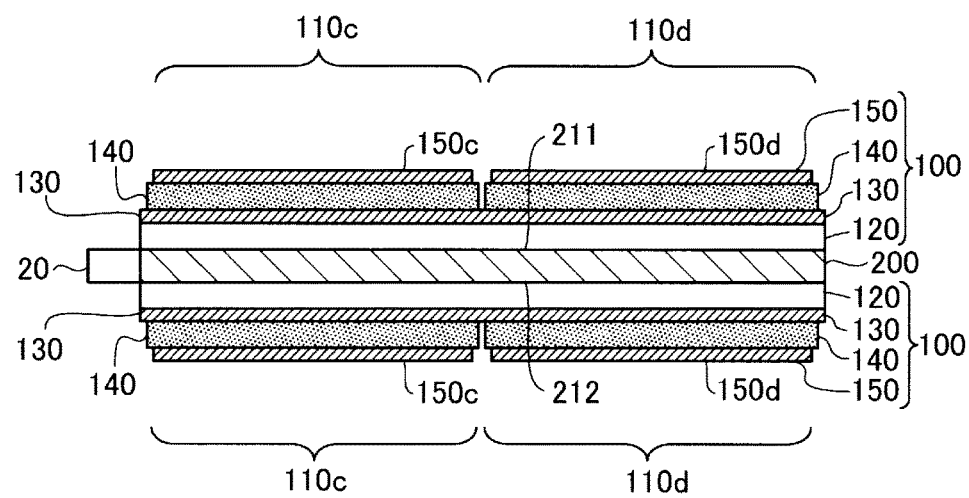

FIG. 1A is a plan view showing a schematic configuration of a piezoelectric driving device 10 in a first embodiment of the invention, and FIG. 1B is a sectional view along line B-B thereof. The piezoelectric driving device 10 includes a vibrating plate 200 and two piezoelectric vibrators 100 respectively provided on both surfaces of the vibrating plate 200 (a first surface 211 (also referred to as "front surface") and a second surface 212 (also referred to as "rear surface")). The piezoelectric vibrator 100 includes a substrate 120, a first electrode 130 formed on the substrate 120, a piezoelectric body 140 formed on the first electrode 130, and a second electrode 150 formed on the piezoelectric body 140. The first electrode 130 and the second electrode 150 sandwich the piezoelectric body 140. The two piezoelectric vibrators 100 are symmetrically provided with respect to the vibrating plate 200. The two piezoelectric vibrators 100 have the same configuration, and the configuration of the piezoelectric vibrator 100 on the upper side of the vibrating plate 200 will be explained unless otherwise noted.

The substrate 120 of the piezoelectric vibrator 100 is used as a substrate for formation of the first electrode 130, the piezoelectric body 140, and the second electrode 150 in a deposition process. Further, the substrate 120 also has a function as a vibrating plate that mechanically vibrates. The substrate 120 may be formed using e.g. Si, $Al_2O_3$, $ZrO_2$, or the like. As an Si substrate 120, e.g. an Si wafer for semiconductor manufacture can be used. In the embodiment, the planar shape of the substrate 120 is a rectangular shape. The thickness of the substrate 120 is preferably e.g. in a range from 10 μm to 100 μm. When the thickness of the substrate 120 is set to 10 μm or more, the substrate 120 may be handled relatively easily in deposition processing on the substrate 120. Note that, when the thickness of the substrate 120 is set to 50 μm or more, the substrate 120 may be handled more easily. Or, when the thickness of the substrate 120 is set to 100 μm or less, the substrate 120 may be vibrated easily in response to expansion and contraction of the piezoelectric body 140 formed by a thin film.

The first electrode 130 is formed as a single continuous conductor layer formed on the substrate 120. On the other hand, the second electrode 150 is sectioned into five conductor layers 150a to 150e (also referred to as "second electrodes 150a to 150e") as shown in FIG. 1A. The second electrode 150e at the center is formed in a rectangular shape over nearly the entire in the longitudinal direction of the substrate 120 at the center in the width direction (lateral direction) of the substrate 120. The other four second electrodes 150a, 150b, 150c, 150d have the same planar shape and are formed in the positions in the four corners of the substrate 120. In the example of FIGS. 1A and 1B, both the first electrode 130 and the second electrode 150 have rectangular planar shapes. The first electrode 130 and the second electrode 150 are thin films formed by e.g. sputtering. As materials for the first electrode 130 and the second electrode 150, arbitrary materials having higher conductivity, e.g., Al (aluminum), Ni (nickel), Au (gold), Pt (platinum), Ir (iridium) are available. Note that, instead of using a single continuous conductor layer for the first electrode 130, the first electrode may be sectioned into five conductor layers having substantially the same planar shapes as the second electrodes 150a to 150e. Also, note that wiring (or a wiring layer and an insulating layer) for electrical connection among the second electrodes 150a to 150e and wiring (or a wiring layer and an insulating layer) for electrical connection among the first electrode 130 and the second electrodes 150a to 150e and the drive circuit are not shown in FIGS. 1A and 1B.

The piezoelectric body 140 is formed as five piezoelectric body layers having substantially the same planar shapes as the second electrodes 150a to 150e. Instead, the piezoelectric body 140 may be formed as a single continuous piezoelectric body layer having substantially the same planar shape as the first electrode 130. Five piezoelectric elements 110a to 110e (FIG. 1A) are formed by the layered structure of the first electrode 130, piezoelectric body 140, and the second electrodes 150a to 150e.

The piezoelectric body 140 is a thin film formed by e.g. the sol-gel method or sputtering method. As the material for the piezoelectric body 140, an arbitrary material that exhibits the piezoelectric effect including ceramics having an $ABO_3$-type perovskite structure is available. As the ceramics having the $ABO_3$-type perovskite structure, e.g. lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, lead zinc niobate, lead scandium niobate, or the like can be used. Or, another material exhibiting the piezoelectric effect than ceramics, e.g., polyvinylidene fluoride, crystal, or the like can be used. It is preferable that the thickness of the piezoelectric body 140 is set e.g. within a range from 50 nm (0.05 μm) to 20 μm. The thin film of the piezoelectric body 140 having the thickness within the range may be easily formed using a deposition process. When the thickness of the piezoelectric body 140 is set to 0.05 μm or more, a sufficiently large force may be generated in response to the expansion and contraction of the piezoelectric body 140. Or, when the thickness of the piezoelectric body 140 is set to 20 μm or less, the piezoelectric driving device 10 may be sufficiently downsized.

Figure 2:
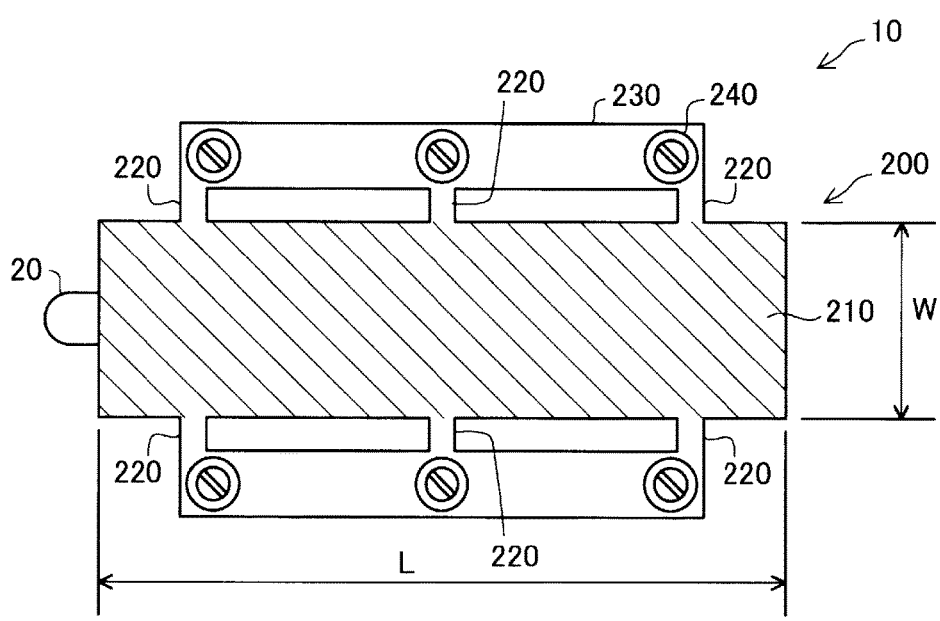
FIG. 2 is a plan view of a vibrating plate.

FIG. 2 is a plan view of the vibrating plate 200. The vibrating plate 200 has a vibrator part 210 having a rectangular shape and three connecting portions 220 respectively extending from the right and left longitudinal sides of the vibrator part 210, and two attachment portions 230 respectively connected to the right and left three connecting portions 220. Note that, in FIG. 2, for convenience of illustration, the vibrator part 210 is hatched. The attachment portions 230 are used for attaching the piezoelectric driving device 10 to another member using screws 240. The vibrating plate 200 can be formed using a metal material, e.g., stainless steel, aluminum, aluminum alloy, titanium, titan alloy, copper, copper alloy, iron-nickel alloy, or the like.

The piezoelectric vibrators 100 (FIGS. 1A and 1B) are respectively bonded to the upper surface (first surface) and the lower surface (second surface) of the vibrator part 210 using adhesive agents. It is preferable that the ratio between the length L and the width W of the vibrator part 210 is set to nearly L:W=7:2. This ratio is a preferable value for the vibrator part 210 to perform ultrasonic vibration (to be described later) of bending to right and left along the plane. The length L of the vibrator part 210 may be set e.g. in a range from 3.5 mm to 30 mm and the width W may be set e.g. in a range from 1 mm to 8 mm. Note that it is preferable to set the length L to 50 mm or less for ultrasonic vibration of the vibrator part 210. The thickness of the vibrator part 210 (the thickness of the vibrating plate 200) may be set e.g. in a range from 50 µm to 700 µm. When the thickness of the vibrator part 210 is set to 50 µm or more, the part has sufficient rigidity for supporting the piezoelectric vibrators 100. Or, when the thickness of the vibrator part 210 is set to 700 µm or less, the part may generate sufficiently large deformation in response to the deformation of the piezoelectric vibrators 100.

A projecting portion 20 (also referred to as "contact portion" or "acting portion") is provided on one short side of the vibrating plate 200. The projecting portion 20 is a member that comes into contact with a driven member and provides force to the driven member. It is preferable to form the projecting portion 20 using a material having durability such as ceramics (e.g. $Al_2O_3$).

Figure 3:
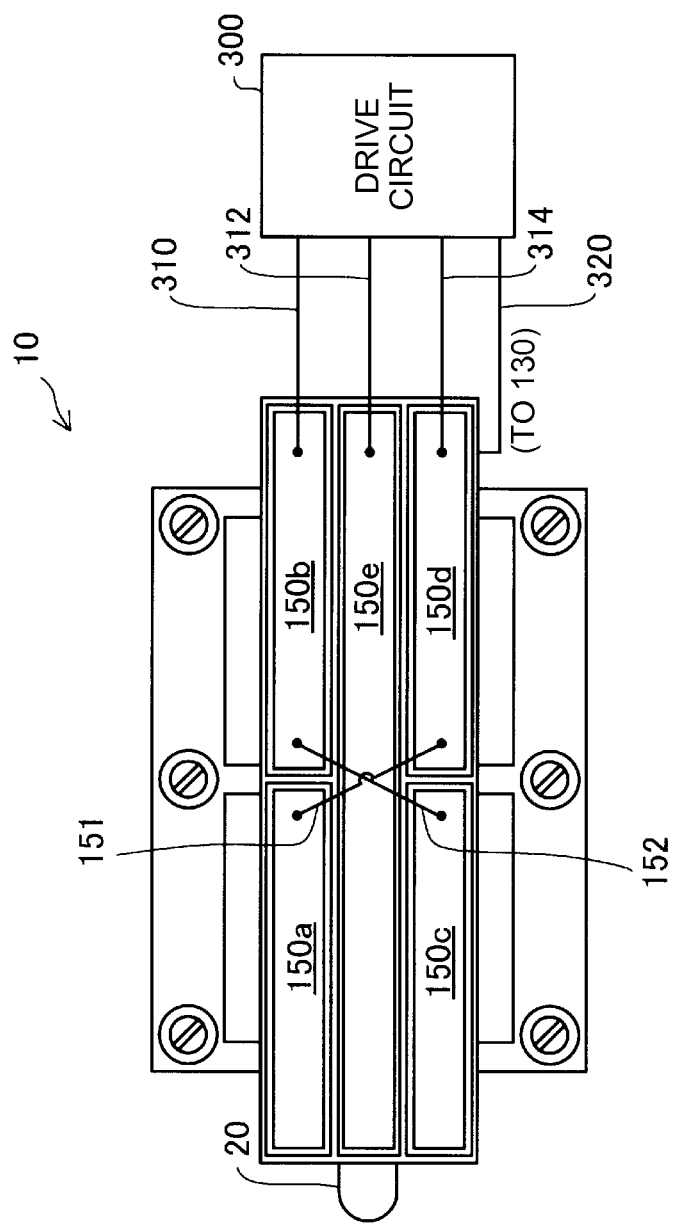
FIG. 3 is an explanatory diagram showing an electrical connection state between the piezoelectric driving device and a drive circuit.

FIG. 3 is an explanatory diagram showing an electrical connection state between the piezoelectric driving device 10 and a drive circuit 300. Of the five second electrodes 150a to 150e, one diagonal pair of second electrodes 150a, 150d are electrically connected to each other via a line 151 and the other diagonal pair of second electrodes 150b, 150c are electrically connected to each other via a line 152. These wires 151, 152 may be formed by deposition processing or implemented by wire-shaped lines. Three second electrodes 150b, 150e, 150d on the right side of FIG. 3 and the first electrode 130 (FIGS. 1A and 1B) are electrically connected to the drive circuit 300 via lines 310, 312, 314, 320. The drive circuit 300 can ultrasonically vibrate the piezoelectric driving device 10 and rotate the rotor (driven member) in contact with the projecting portion 20 in a predetermined rotation direction by applying a periodically changing alternating-current voltage or undulating voltage between the one pair of second electrodes 150a, 150d and the first electrode 130. Here, "undulating voltage" refers to a voltage formed by addition of a DC offset to an alternating-current voltage, the direction of the voltage (electric field) is one direction from one electrode to the other electrode. Further, the circuit can rotate the rotor in contact with the projecting portion 20 in the opposite direction by applying an alternating-current voltage or undulating voltage between the other pair of second electrodes 150b, 150c and the first electrode 130. The voltage application is performed at the same time on the two piezoelectric vibrators 100 provided on the surfaces of the vibrating plate 200. Note that the wiring (or the wiring layer and the insulating layer) forming the lines 151, 152, 310, 312, 314, 320 shown in FIG. 3 is not shown in FIGS. 1A and 1B.

Figure 4:
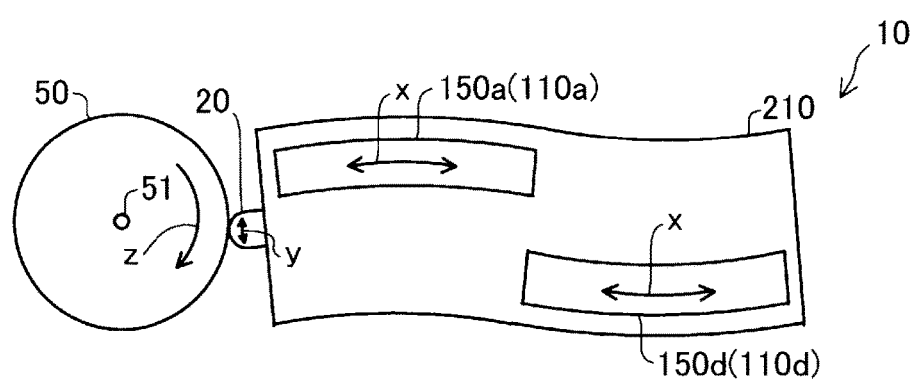
FIG. 4 is an explanatory diagram showing an example of a movement of the piezoelectric driving device.

FIG. 4 is an explanatory diagram showing an example of a movement of the piezoelectric driving device 10. The projecting portion 20 of the piezoelectric driving device 10 is in contact with the outer circumference of a rotor 50 as a driven member. In the example shown in FIG. 4, the drive circuit 300 (FIG. 3) applies the alternating-current voltage or undulating voltage between the one pair of second electrodes 150a, 150d and the first electrode 130, and piezoelectric elements 110a, 110d expand and contract in directions of arrows x in FIG. 4. In response thereto, the vibrator part 210 of the piezoelectric driving device 10 is bended within the plane of the vibrator part 210 and deformed into a meandering shape (S-shape), and the end of the projecting portion 20 performs reciprocating motion in the directions of arrows y or elliptic motion. As a result, the rotor 50 rotates about its center 51 in a predetermined direction z (clockwise direction in FIG. 4). The three connecting portions 220 (FIG. 2) of the vibrating plate 200 explained in FIG. 2 are provided in positions of nodes of the vibration of the vibrator part 210. Note that, when the drive circuit 300 applies the alternating-current voltage or undulating voltage between the other pair of second electrodes 150b, 150c and the first electrode 130, the rotor 50 rotates in the opposite direction. If the same voltage as that to the one pair of second electrodes 150a, 150d (or the other pair of second electrodes 150b, 150c) is applied to the second electrode 150e at the center, the piezoelectric driving device 10 expands and contracts in the longitudinal directions, and the force provided from the projecting portion 20 to the rotor 50 can be made larger. Note that the movement of the piezoelectric driving device 10 (or piezoelectric vibrator 100) is disclosed in the related art document (JP-A-2004-320979 or the counterpart U.S. Pat. No. 7,224,102), and the disclosed contents are incorporated herein by reference.

Figure 5:
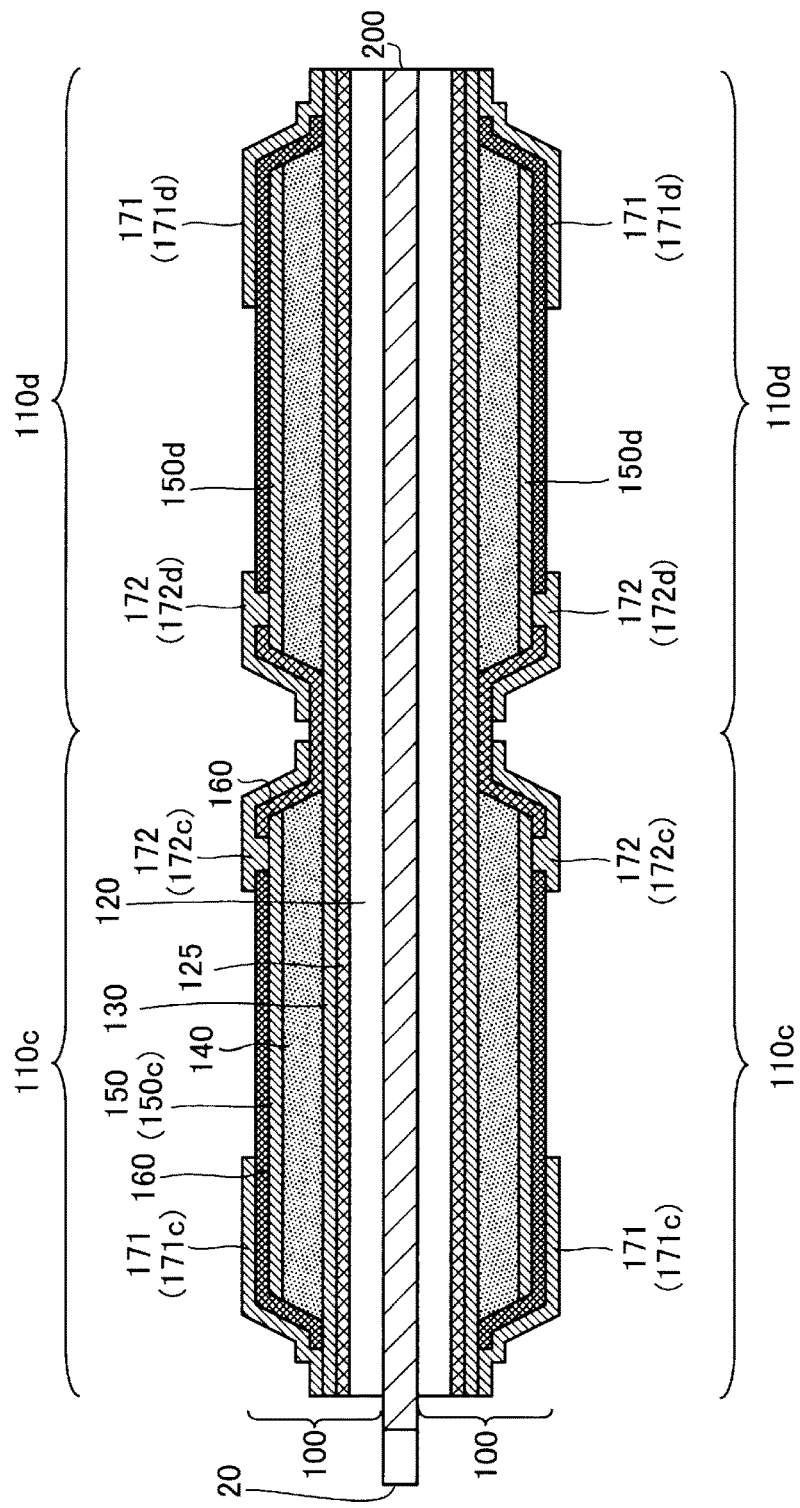
FIG. 5 is a detailed sectional view of the piezoelectric driving device cut along a plane of section in parallel to the longitudinal direction.

FIG. 5 is a sectional view of the example of the sectional structure shown in FIG. 1B further in detail. The piezoelectric vibrator 100 includes the substrate 120, an insulating layer 125, the first electrode 130, the piezoelectric body 140, the second electrodes 150, an insulating layer 160, and lead electrodes 171, 172. Note that, in FIG. 5, the plurality of second electrodes 150 and the plurality of lead electrodes 171, 172 are distinguished by addition of an index "c" or "d". In FIG. 5, the lines 151, 152 shown in FIG. 3 are not shown.

The insulating layer 125 is formed on the substrate 120 and insulates between the substrate 120 and the first electrode 130. The first electrode 130 is formed on the insulating layer 125. The piezoelectric body 140 is formed on the first electrode 130. The second electrode 150 is formed on the piezoelectric body 140. The insulating layer 160 is formed on the second electrode 150. Further, the insulating layer 160 has openings (contact holes) in its parts for the first lead electrode 171 into contact with the first electrode 130 and the second lead electrode 172 into contact with the second electrode 150. The first lead electrode 171 is formed on the insulating layer 160 and in contact with the first electrode 130. The second lead electrode 172 is formed on the insulating layer 160 and in contact with the second electrode 150. Note that the two lead electrodes 171, 172 are not directly connected to each other. In FIG. 5, for convenience of illustration, the second lead electrodes 172c, 172d are formed in positions closer to the boundary between the piezoelectric element 110c and the piezoelectric element 110d, however, the second lead electrodes 172c, 172d may be formed on both ends in the longitudinal direction of the vibrating plate 200 on the opposite sides to the boundary between the piezoelectric element 110c and the piezoelectric element 110d. In this case, when the positions of the first lead electrodes 171c, 171d and the second lead electrodes 172c, 172d in the width direction (in the lateral direction of the vibrating plate 200) are different, they are not connected to each other. The second lead electrodes 172c, 172d may extend to regions without the piezoelectric body 140 underneath. If the lines 151, 152, 314 are connected to the second lead electrodes 172 in the regions without the piezoelectric body 140 underneath, electrostatic breakdown of the piezoelectric body 140 due to wiring connection is harder to occur.

Figure 6:
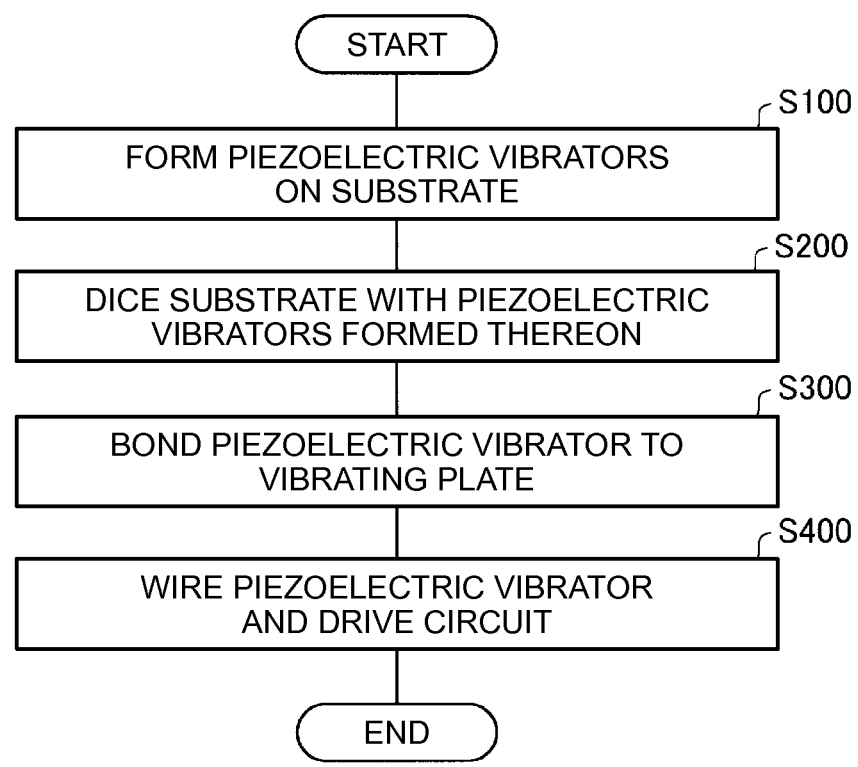
FIG. 6 is a manufacturing flowchart of the piezoelectric driving device.
Figure 7A:
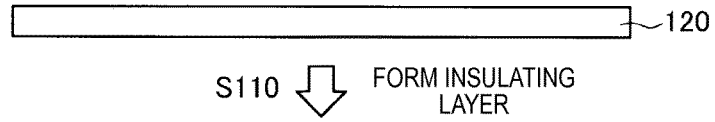
FIGS. 7A to 7H are explanatory diagrams showing a manufacturing process of a piezoelectric vibrator at step S100 in FIG. 6.
Figure 7B:
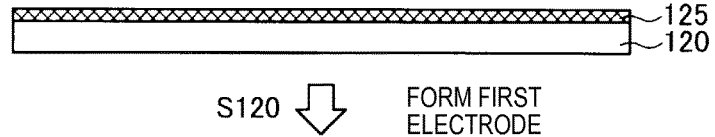
Figure 7C:
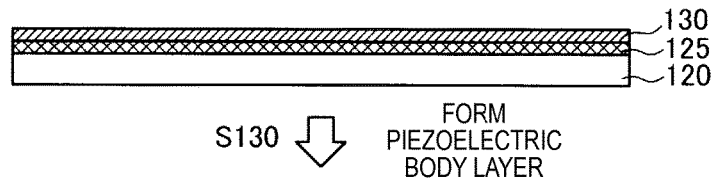
Figure 7D:
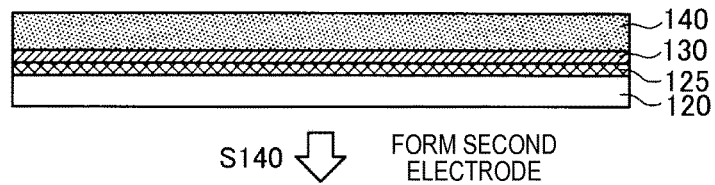
Figure 7E:
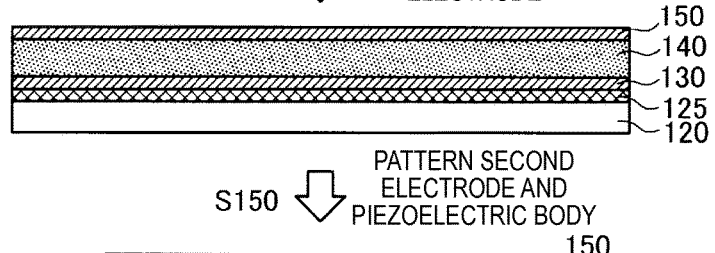
Figure 7F:
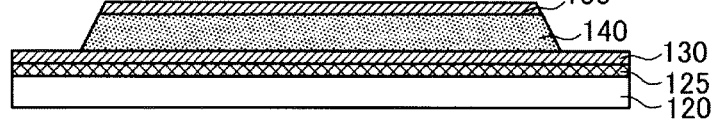
Figure 7G:
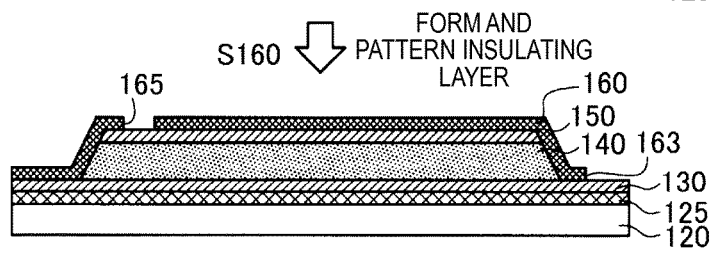
Figure 7H:
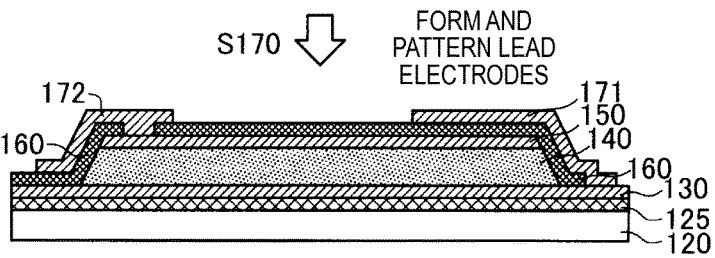

FIG. 6 is an explanatory diagram showing a manufacturing flowchart of the piezoelectric driving device 10. At step S100, the piezoelectric element 110 is formed on the substrate 120, and thereby, the piezoelectric vibrator 100 is formed. In this regard, as the substrate 120, e.g. an Si wafer may be used. A plurality of the piezoelectric vibrators 100 can be formed on the single Si wafer. Further, Si has a value of mechanical quality factor Qm as large as about a hundred thousand, and the mechanical quality factors Qm of the piezoelectric vibrators 100 and the piezoelectric driving device 10 may be made larger. At step S200, the substrate 120 with the piezoelectric driving devices 10 formed thereon are diced and divided into individual piezoelectric vibrators 100. Note that, before dicing of the substrate 120, the rear surface of the substrate 120 may be ground so that the substrate 120 may have a desired thickness. At step S300, the two piezoelectric vibrators 100 are bonded to the surfaces of the vibrating plate 200 using adhesive agents. At step S400, the wiring layers of the piezoelectric vibrators 100 and the drive circuit are electrically connected by wiring.

FIGS. 7A to 7H are explanatory diagrams showing a manufacturing process of the piezoelectric vibrator 100 at step S100 in FIG. 6. FIGS. 7A to 7H show a process of forming the piezoelectric element 110d shown in the upper part of the right half of FIG. 5. At step S110, the substrate 120 is prepared and the insulating layer 125 is formed on the front surface of the substrate 120. As the insulating layer 125, e.g. an $SiO_2$ layer formed by thermal oxidation of the front surface of the substrate 120 may be used. In addition, alumina ($Al_2O_3$) or an organic material such as acryl or polyimide may be used for the insulating layer. Note that, when the substrate 120 is an insulator, the step of forming the insulating layer 125 may be omitted.

At step S120, the first electrode 130 is formed on the insulating layer 125. The first electrode 130 may be formed by e.g. sputtering.

At step S130, the piezoelectric body 140 is formed on the first electrode 130. Specifically, the piezoelectric body 140 can be formed using e.g. the sol-gel method. That is, a sol-gel solution of a piezoelectric body material is dropped on the substrate 120 (first electrode 130), the substrate 120 is rotated at a high speed, and thereby, a thin film of the sol-gel solution is formed on the first electrode 130. Then, preliminary calcination is performed at a temperature of 200 to 300° C. and a first layer of the piezoelectric material is formed on the first electrode 130. Then, a cycle of dropping of the so-gel solution, high-speed rotation, preliminary calcination is repeated at a plurality of times, and thereby, the piezoelectric body layer is formed to a desired thickness on the first electrode 130. Note that the thickness of one layer of the piezoelectric body formed in one cycle is a thickness of about 50 nm to 150 nm, though depending on the viscosity of the sol-gel solution and the rotation speed of the substrate 120. The piezoelectric body layer is formed to the desired thickness, then, sintered at a temperature of 600° C. to 1000° C., and thereby, the piezoelectric body 140 is formed. When the thickness of the sintered piezoelectric body 140 is set to be from 50 nm (0.05 μm) to 20 μm, the smaller piezoelectric driving device 10 may be implemented. Note that, when the thickness of the piezoelectric body 140 is set to 0.05 μm or more, a sufficiently large force may be generated in response to the expansion and contraction of the piezoelectric body 140. Further, when the thickness of the piezoelectric body 140 is set to 20 μm or less, a sufficiently large force may be generated even when the voltage applied to the piezoelectric body 140 is equal to or less than 600 V. As a result, the drive circuit 300 for driving the piezoelectric driving device 10 may be formed using inexpensive elements. Note that the thickness of the piezoelectric body 140 may be set to 400 nm or more, and, in this case, the force generated in the piezoelectric element may be increased. The temperatures and periods for the preliminary calcination and sintering are just examples and appropriately selected depending on the piezoelectric body material.

In the case where the thin film of the piezoelectric body material is formed using the so-gel method and sintered, there are advantages that (a) the thin film is formed more easily, (b) crystallization with oriented lattice direction is performed more easily, and (c) the withstand voltage of the piezoelectric body may be improved compared to the sintering method of mixing and sintering raw material powder in related art.

At step S140, the second electrode 150 is formed on the piezoelectric body 140. The formation of the second electrode 150 may be performed by sputtering like the first electrode.

At step S150, the second electrode 150 and the piezoelectric body 140 are patterned. In the embodiment, patterning of the second electrode 150 and the piezoelectric body 140 is performed by ion milling using an argon ion beam. Note that the period for ion milling is controlled, and thereby, only patterning of the second electrode 150 and the piezoelectric body 140 except the first electrode 130 can be performed. Note that, in place of patterning using ion milling, patterning may be performed by another arbitrary patterning method (e.g. dry etching using chlorine-containing gas).

At step S160, the insulating layer 160 is formed on the first electrode 130 and the second electrode 150. As the insulating layer 160, a phosphorus-containing silicon oxide film (PSG film), a boron phosphorus-containing silicon oxide film (BPSG film), an NSG film (silicon oxide film containing no impurities such as boron or phosphorus), a silicon nitride film ($Si_3N_4$ film), or the like can be used. The insulating layer 160 may be formed by e.g. the CVD method. After the formation of the insulating layer 160, patterning for forming contact holes 163, 165 with the first electrode 130 and the second electrode 150 is performed.

At step S170, a conductor layer for lead electrodes is formed and patterned. The conductor layer may be formed using e.g. aluminum and formed by sputtering. Then, the conductor layer is patterned, and thereby, the first lead electrode 171 and the second lead electrode 172 are formed. The first lead electrode 171 is connected to the first electrode 130 and the second lead electrode 172 is connected to the second electrode 150. Note that, when the first electrodes 130 of the piezoelectric elements 110a to 110e form a single continuous conductor layer, the second lead electrodes 172 are not necessarily formed in the other piezoelectric elements 110a, 110b, 110c, 110e. The second lead electrode 172 may extend to a region without the piezoelectric body 140 underneath. If the lines 151, 152, 314 are connected to the second lead electrodes 172 in the regions without the piezoelectric body 140 underneath, the wiring connection does not affect the piezoelectric body 140. Further, both the first lead electrode 171 and the second lead electrode 172 may be left on the insulating layer 160. When the wiring layer is formed in the vibrating plate 200 and the piezoelectric element 110 is provided between the substrate 120 and the vibrating plate 200, the wiring layer of the vibrating plate 200 and the first lead electrode 171, the second lead electrode 172 may be electrically connected more easily.

Then, though not illustrated, a passivation film is formed on the first lead electrode 171 and the second lead electrode 172. The passivation film may be formed using e.g. SiN, polyimide. Then, opening portions (contact holes) for connection of the first lead electrodes 171 and the second lead electrodes 172 to the lines 151, 152, 310, 312, 314, 320 (FIG. 3) are formed.

FIGS. 8A and 8B are explanatory diagram showing an example of wiring between the piezoelectric driving device 10 and the drive circuit 300. Here, the connection states of wiring on the front surface side and the rear surface side of the piezoelectric driving device 10 are shown. Note that, for convenience of illustration, the sizes of the electrodes 150a to 150e etc. are different from those in FIGS. 1A and 1B. The second electrodes 150a, 150b, 150c, 150d, 150e, the first lead electrodes 171a, 171b, 171c, 171d, 171e, and the second lead electrodes 172a, 172b, 172c, 172d, 172e are respectively provided on the front surface and the rear surface of the piezoelectric driving device. Here, for distinction of the piezoelectric elements 110a to 110e, indices a, b, c, d, e are added to the ends of the second electrodes 150, the first lead electrodes 171, and the second lead electrodes 172. Note that, when the first electrode 130 forms a single continuous conductor layer, the first lead electrodes 171a, 171b, 171c, 171d, 171e shown by broken lines in FIGS. 8A and 8B are not necessarily formed.

The lines connecting the respective electrodes of the piezoelectric driving device 10 are wired as follows.

The line 151 connects the second lead electrode 172a and the second lead electrode 172d on the front surface side.

The line 152 connects the second lead electrode 172b and the second lead electrode 172c on the front surface side.

A line 182a connects the second lead electrode 172a on the front surface side and the second lead electrode 172a on the rear surface side.

A line 182b connects the second lead electrode 172b on the front surface side and the second lead electrode 172b on the rear surface side.

A line 182c connects the second lead electrode 172c on the front surface side and the second lead electrode 172c on the rear surface side.

A line 182d connects the second lead electrode 172d on the front surface side and the second lead electrode 172d on the rear surface side.

The respective electrodes of the piezoelectric driving device 10 and the drive circuit are connected as follows.

The line 310 connects the drive circuit 300 and the second lead electrode 172b on the front surface side.

The line 312 connects the drive circuit 300 and the second lead electrode 172e on the front surface side and the second lead electrode 172e on the rear surface side.

The line 314 connects the drive circuit 300 and the second lead electrode 172d on the front surface side.

The line 320 connects the drive circuit 300 and the first lead electrode 171d on the front surface side and the first lead electrode 171d on the rear surface side.

By application of an alternating-current voltage or undulating voltage between the lines 310 and 320, as described above, the piezoelectric elements 110b, 110c (FIG. 1A) may be driven. Further, by application of an alternating-current voltage or undulating voltage between the lines 314 and 320, the piezoelectric elements 110a, 110d (FIG. 1A) may be driven. By application of an alternating-current voltage or undulating voltage between the lines 312 and 320, the piezoelectric element 110e (FIG. 1A) may be driven.

As above, according to the embodiment, the thickness of the piezoelectric body 140 is set to be from 50 nm (0.05 μm) to 20 μm, and thereby, the smaller piezoelectric driving device 10 may be implemented. Note that, when the thickness of the piezoelectric body 140 is set to 0.05 μm or more, a sufficiently large force may be generated in response to the expansion and contraction of the piezoelectric body 140. Further, when the thickness of the piezoelectric body 140 is set to 20 μm or less, a sufficiently large force may be generated even when the voltage applied to the piezoelectric body 140 is equal to or less than 600 V. Therefore, the drive circuit 300 for driving the piezoelectric driving device 10 may be formed using inexpensive elements. Note that the voltage actually applied to the piezoelectric body 140 is sufficient in a range from 20 to 40 V. In addition, the thickness of the piezoelectric body may be set to 400 nm or more, and, in this case, the force generated in the piezoelectric element may be increased.

According to the embodiment, the piezoelectric elements (110a to 110e) are formed on the substrate 120, and thereby, the value of mechanical quality factor Qm of the piezoelectric driving device 10 may be made larger than that of the case without the substrate 120. Particularly, the mechanical quality factor Qm value of the Si substrate is about a hundred thousand, and, when the Si substrate 120 is used, the value of mechanical quality factor Qm of the piezoelectric driving device 10 may be made larger.

Further, according to the embodiment, the piezoelectric vibrator 100 has the substrate 120, the first electrode 130 provided on the substrate 120, the piezoelectric body 140 provided on the first electrode 130, and the second electrode 150 provided on the piezoelectric body 140, and thereby, even when the thickness of the piezoelectric body 140 is made thinner, the mechanical strength and the mechanical quality factor Qm of the piezoelectric vibrator 100 may be made larger. Furthermore, in the embodiment, the silicon substrate is used as the substrate 120. The value of the mechanical quality factor Qm of the piezoelectric body 140 is several thousands and, in contrast, the value of the mechanical quality factor Qm of the substrate 120 is about a hundred thousand. Therefore, the value of the mechanical quality factor Qm of the piezoelectric driving device 10 may be made larger.

According to the embodiment, the thickness of the substrate 120 may be from 10 μm to 100 μm. When the thickness of the substrate 120 is set to 10 μm or more, the substrate 120 may be handled relatively easily in deposition processing on the substrate 120. Further, when the thickness of the substrate 120 is set to 100 μm or less, the substrate 120 may be vibrated easily in response to expansion and contraction of the piezoelectric body 140 formed by a thin film.

According to the embodiment, the piezoelectric vibrator 100 has the insulating layer 160 on the second electrode 150, and the first lead electrode 171 connected to the first electrode 130 and the second lead electrode 172 connected to the second electrode 150 on the insulating layer 160, and thereby, the lines 151, 152, 310, 312, 314, 320 may be wired to the first lead electrode 171, the second lead electrode 172 and voltages may be applied from the first lead electrode 171, the second lead electrode 172. Further, compared to the case of direct wiring to the first electrode 130, the second electrode 150, electrostatic breakdown of the piezoelectric body 140 or the like is harder to occur when the wiring is connected and leakage current of the piezoelectric body 140 may be suppressed.

It is preferable to form the piezoelectric body 140 by the sol-gel method because the thinner piezoelectric body is easily formed. Further, it is preferable to easily orient the lattice direction of the crystal of the piezoelectric body because deformation of the shape of the piezoelectric body may be made larger when the same voltage is applied and the withstand voltage may be made larger. Note that the piezoelectric body 140 may be formed by the sputtering method. The same advantage as that by the sol-gel method may be obtained by the sputtering method.

Other Embodiments of Piezoelectric Driving Device

Figure 9:
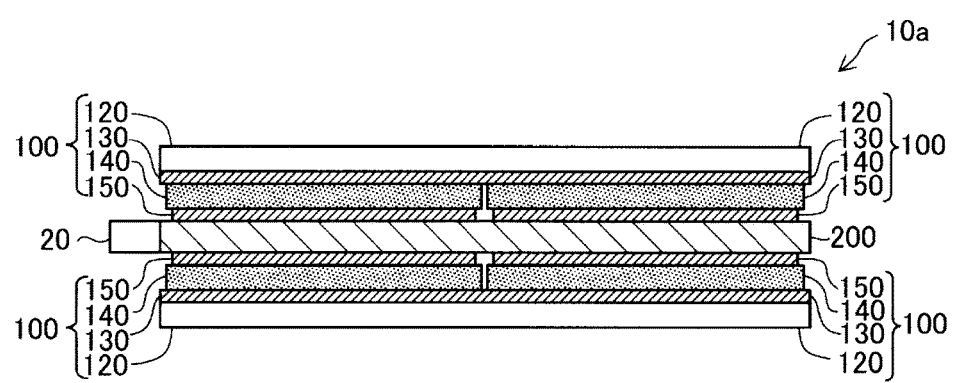
FIG. 9 is a sectional view of a piezoelectric driving device as another embodiment of the invention.

FIG. 9 is a sectional view of a piezoelectric driving device 10a as another embodiment of the invention, and corresponds to FIG. 1B of the first embodiment. In the piezoelectric driving device 10a, the piezoelectric vibrator 100 is provided upside down to that in FIG. 1B on the vibrating plate 200. That is, here, the vibrator is provided so that the second electrode 150 may be closer to the vibrating plate 200 and the substrate 120 may be farthest from the vibrating plate 200. Note that, also, in FIG. 9, like FIG. 1B, wiring (or a wiring layer and an insulating layer) for electrical connection among the second electrodes 150a to 150e and wiring (or a wiring layer and an insulating layer) for electrical connection among the first electrode 130 and the second electrodes 150a to 150e and the drive circuit are not shown. The piezoelectric driving device 10a may also achieve the same effect as that of the first embodiment.

FIGS. 10A to 10E are explanatory diagrams showing a manufacturing process of the piezoelectric driving device 10a shown in FIG. 9. At step S510, the vibrating plate 200 is prepared and insulating layers 202 are formed. The insulating layers 202 can be formed using e.g. an insulating resin such as polyimide. At step S520, wiring layers 204 are formed on the insulating layers 202 and the wiring layers 204 are patterned. The wiring layers 204 include first wiring and second wiring. For the wiring layers 204, copper or aluminum may be used. At step S530, insulating layers 206 are formed on the wiring layers 204 and opening portions are patterned. The insulating layers 206 may be formed using e.g. solder resists.

Figure 10A:
FIGS. 10A to 10E are sectional views of the piezoelectric driving device of the other embodiment.
Figure 10B:
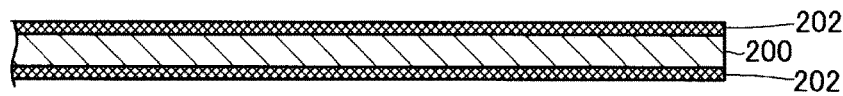
Figure 10C:
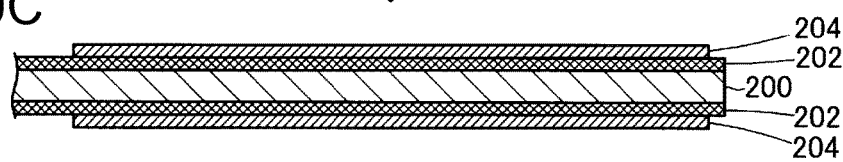
Figure 10D:
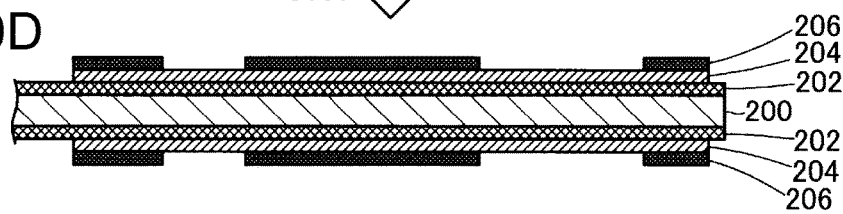
Figure 10E:
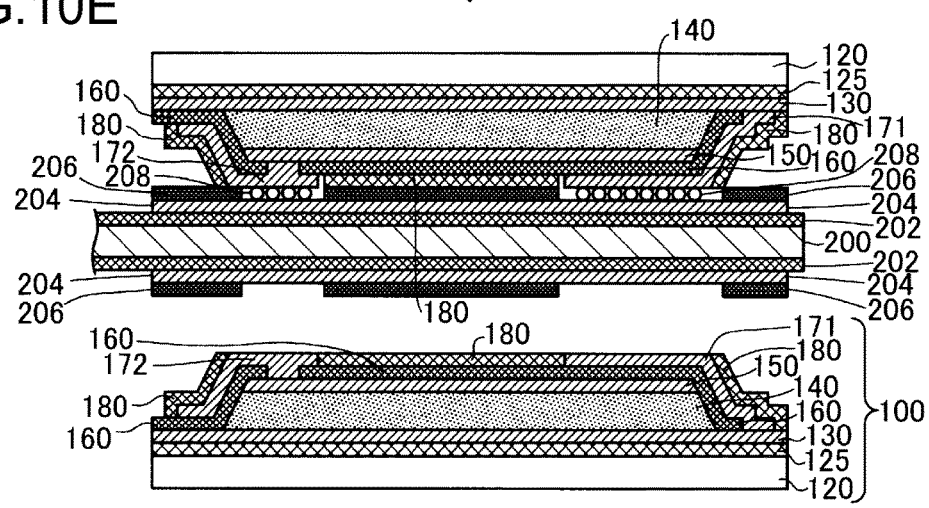

At step S540, the piezoelectric vibrators 100 individually formed by the step S200 in FIG. 6 (FIGS. 7A to 7H) are bonded to both surfaces of the vibrating plate 200. In this regard, conducting members 208 are provided between the wiring layers 204 and the first lead electrodes 171, the second lead electrodes 172 for electrical contact via the conducting members 208. Specifically, the first wiring of the wiring layer 204 and the first lead electrode 171 are brought into electrical contact and the second wiring of the wiring layer 204 and the second lead electrode 172 are brought into electrical contact. By intervention of the conducting members 208, even when there are steps between the wiring layers 204 of the vibrating plate 200 and the first lead electrodes 171 and the second lead electrodes 172 of the piezoelectric vibrators 100, the steps may be relaxed for electrical contact. As the conducting members 208, e.g. micro bumps or conducting paste may be used. The first surface side in FIG. 10E shows a state in which the piezoelectric vibrator 100 has been bonded and the second surface side shows a state immediately before bonding of the piezoelectric vibrator 100. Note that the above described passivation films 180 are formed in the upper parts of the piezoelectric vibrators 100 shown in FIG. 10E. The passivation films 180 protect around the first lead electrodes 171, the second lead electrodes 172 and suppress electrical short circuit between the first lead electrodes 171, the second lead electrodes 172 and the other members. Note that, in this embodiment, the shape of the second lead electrode 172 is extended to a region without the piezoelectric body 140 underneath, however, it is not necessarily extended. This is because the second lead electrode 172 is connected to the wiring layer 204 of the vibrating plate 200 via the conducting member 208 and it is not necessary to extend the electrode to the region without the piezoelectric body 140 underneath.

Then, the wiring layers 204 and the drive circuit 300 (FIGS. 8A and 8B) are connected by the lines 310, 312, 314, 320. That is, in the embodiment, the lines 310, 312, 314, 320 are not directly wired to the first lead electrodes 171, the second lead electrode 172, but wired via the wiring layers 204. Accordingly, direct wiring to the vibrating piezoelectric vibrators 100 is not necessary and, even when the piezoelectric vibrators 100 vibrate, detachment of the wiring is harder. In the embodiment, the lines 310, 312, 314, 320 are connected after the piezoelectric vibrators 100 are bonded to the vibrating plate 200, however, the lines 310, 312, 314, 320 may be first connected, and then, the piezoelectric vibrators 100 may be bonded to the vibrating plate 200.

Figure 11A:
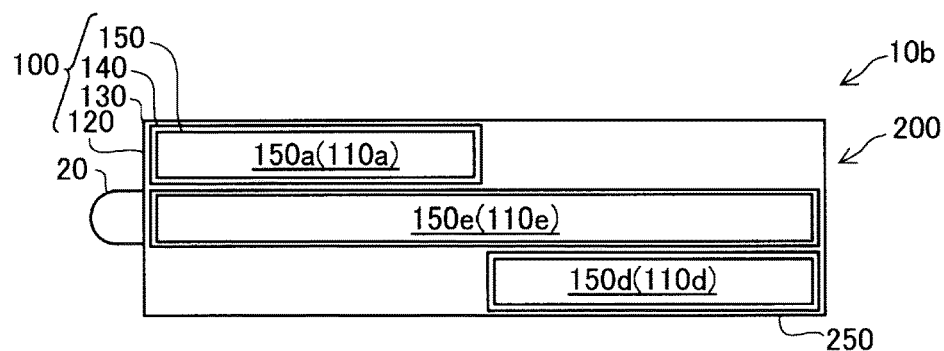
FIGS. 11A to 11C are plan views of piezoelectric driving devices of the other embodiments.
Figure 11B:
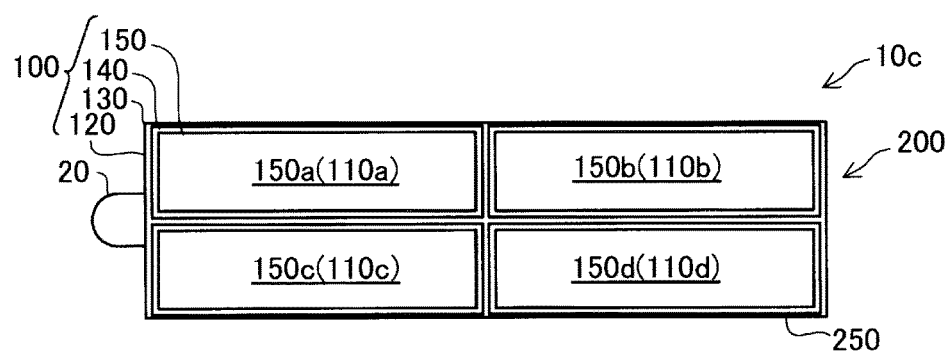
Figure 11C:
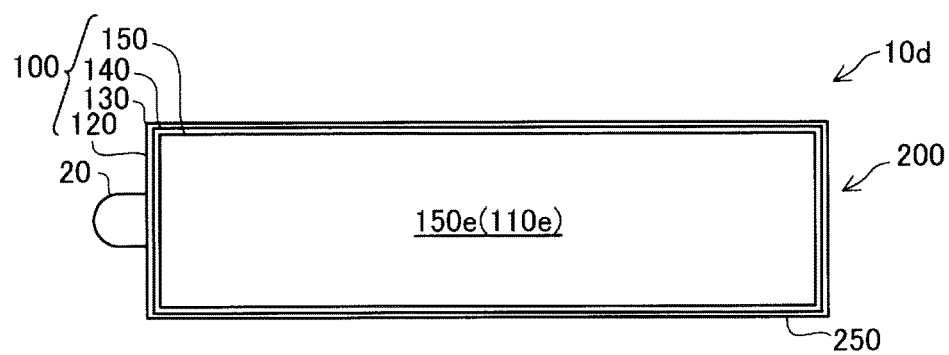

FIG. 11A is a plan view of a piezoelectric driving device 10b as yet another embodiment of the invention and corresponds to FIG. 1A of the first embodiment. In FIGS. 11A to 11C, for convenience of illustration, the connecting portions 220 and the attachment portions 230 of the vibrating plate 200 are not shown. In the piezoelectric driving device 10b of FIG. 11A, a pair of second electrodes 150b, 150c are omitted. The piezoelectric driving device 10b can also rotate the rotor 50 in one direction z as shown in FIG. 4. Note that the same voltage is applied to the three second electrodes 150a, 150e, 150d in FIG. 11A, and the three second electrodes 150a, 150e, 150d may be formed as a single continuous electrode layer.

FIG. 11B is a plan view of a piezoelectric driving device 10c as yet another embodiment of the invention. In the piezoelectric driving device 10c, the second electrode 150e at the center in FIG. 1A is omitted and the other four second electrodes 150a, 150b, 150c, 150d are formed in larger areas than those in FIG. 1A. The piezoelectric driving device 10c also may achieve nearly the same effect as that of the first embodiment.

FIG. 11C is a plan view of a piezoelectric driving device 10d as yet another embodiment of the invention. In the piezoelectric driving device 10d, the four second electrodes 150a, 150b, 150c, 150d in FIG. 1A are omitted and one second electrode 150e is formed in a larger area. The piezoelectric driving device 10d only expands and contracts in the longitudinal directions, but can provide a larger force to the driven member (not shown) from the projecting portion 20.

As will be understood from FIGS. 1A and 1B and FIGS. 11A to 11C, as the second electrode 150 of the piezoelectric vibrator 100, at least one electrode layer may be provided. Note that, as in the embodiments shown in FIGS. 1A and 1B and FIGS. 11A to 11B, it is preferable to provide the second electrodes 150 in diagonal positions of the rectangular piezoelectric vibrator 100 because the piezoelectric vibrator 100 and the vibrating plate 200 can be deformed to bend into a meandering shape within the plane.

Embodiments of Apparatuses Using Piezoelectric Driving Device

The above described piezoelectric driving device 10 may provide a larger force to a driven member using resonance, and can be applied to various apparatuses. The piezoelectric driving device 10 may be used as a driving device in various apparatuses including e.g. a robot (including an electronic part carrying apparatus (IC handler)), a chemical dosing pump, a calendar advancing apparatus of a clock, and a printing apparatus (e.g. a paper feed mechanism, though not applied to a head because the vibrating plate is not resonated in a piezoelectric driving device used for the head). As below, representative embodiments will be explained.

Figure 12:
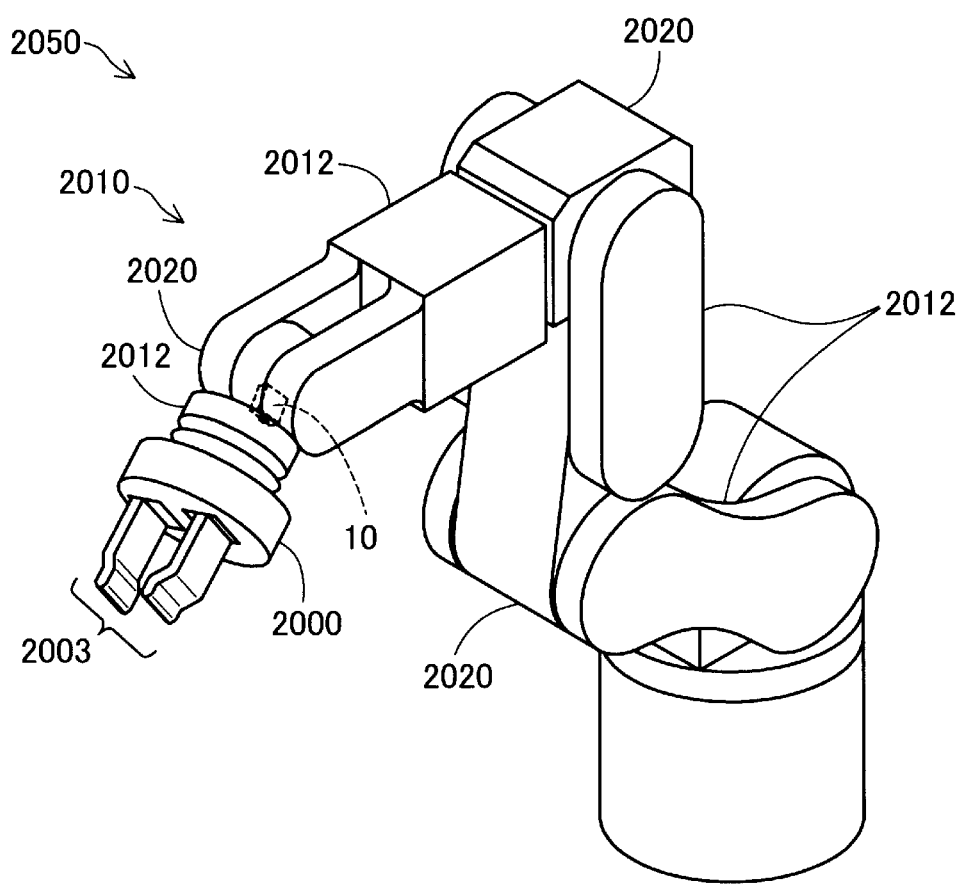
FIG. 12 is an explanatory diagram showing an example of a robot using the piezoelectric driving devices.

FIG. 12 is an explanatory diagram showing an example of a robot 2050 using the above described piezoelectric driving devices 10. The robot 2050 has an arm 2010 (also referred to as "arm part") including a plurality of link parts 2012 (also referred to as "link members") and a plurality of joint parts 2020 rotatably or bendably connecting between the link parts 2012. Each joint part 2020 contains the above described piezoelectric driving devices 10 and can rotate or bend the joint part 2020 to an arbitrary angle using the piezoelectric driving device 10. A robot hand 2000 is connected to the distal end of the arm 2010. The robot hand 2000 includes a pair of grasping parts 2003. The robot hand 2000 also contains the piezoelectric driving device 10 and can grasp an object by opening and closing the grasping parts 2003 using the piezoelectric driving device 10. Further, the piezoelectric driving device 10 is also provided between the robot hand 2000 and the arm 2010 and can rotate the robot hand 2000 with respect to the arm 2010 using the piezoelectric driving device 10.

Figure 13:
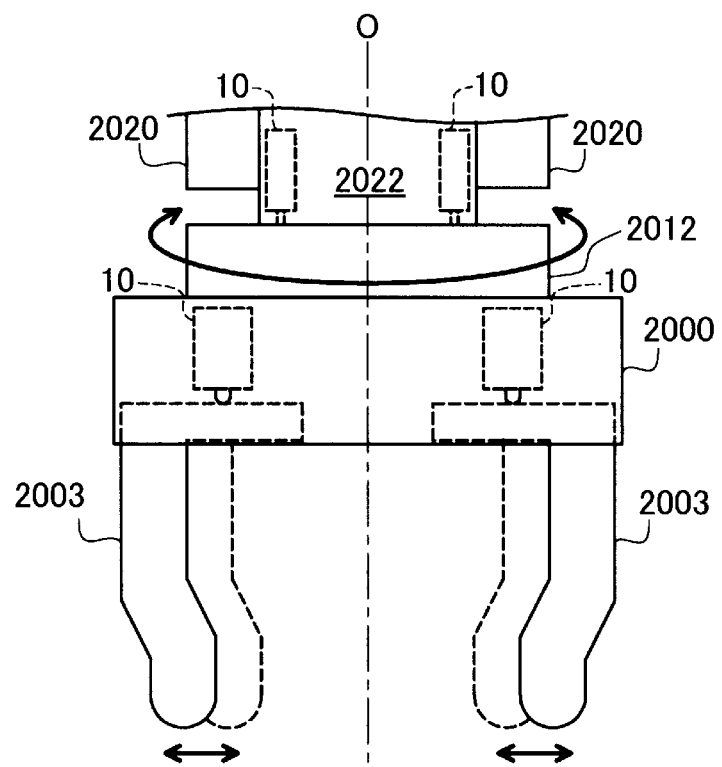
FIG. 13 is an explanatory diagram of a wrist part of the robot.

FIG. 13 is an explanatory diagram of a wrist part of the robot 2050 shown in FIG. 12. The joint parts 2020 sandwich a wrist rotating part 2022 and the link part 2012 of the wrist is rotatably attached about the center axis O of the wrist rotating part 2022. The wrist rotating part 2022 contains the piezoelectric driving device 10 and the piezoelectric driving device 10 rotates the link part 2012 of the wrist and the robot hand 2000 about the center axis O. In the robot hand 2000, the plurality of grasping parts 2003 are stood. The base end parts of the grasping parts 2003 are movable within the robot hand 2000 and the piezoelectric driving devices 10 are provided in the base parts of the grasping parts 2003. Accordingly, the piezoelectric driving devices 10 are operated, and thereby, the grasping parts 2003 may be moved to grasp an object.

Note that, as a robot, the piezoelectric driving device 10 may be applied not only to a single-arm robot but also to a multi-arm robot having two or more arms. Here, the joint parts 2020 of the wrist and the robot hand 2000 contain not only the piezoelectric driving devices 10 but also power lines for supplying power to various devices including force sensors and gyro sensors, signal lines for transmitting signals, etc., and lots of wiring is necessary. Therefore, it was very difficult to provide wiring within the joint parts 2020 and the robot hand 2000. However, in the piezoelectric driving device 10 of the above described embodiment, a drive current may be made smaller than in a general electric motor or a piezoelectric driving device in related art, and thus, wiring can be provided even in the smaller spaces in the joint parts 2020 (specifically, the joint parts of the distal end of the arm 2010) and the robot hand 2000.

Figure 14:
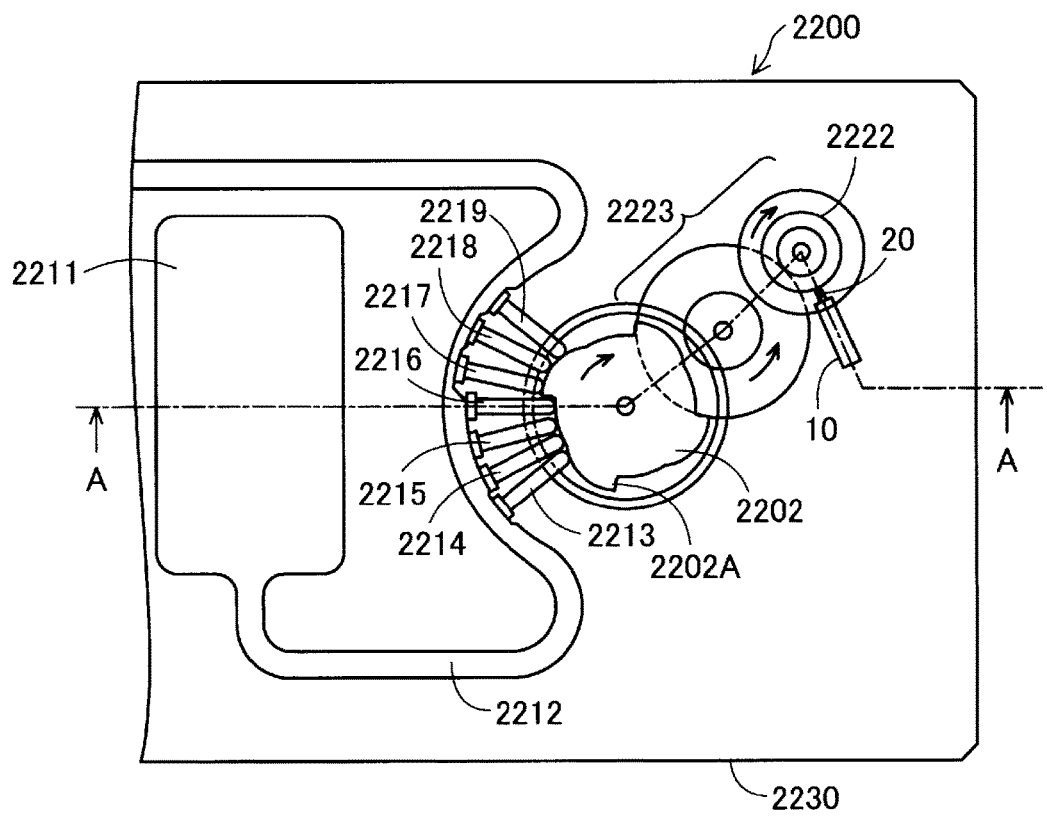
FIG. 14 is an explanatory diagram showing an example of a liquid delivery pump using the piezoelectric driving device.

FIG. 14 is an explanatory diagram showing an example of a liquid delivery pump 2200 using the above described piezoelectric driving device 10. In the liquid delivery pump 2200, a reservoir 2211, a tube 2212, the piezoelectric driving device 10, a rotor 2222, a reduction transmission mechanism 2223, a cam 2202, and a plurality of fingers 2213, 2214, 2215, 2216, 2217, 2218, 2219 are provided within a case 2230. The reservoir 2211 is a container part for housing a liquid to be carried. The tube 2212 is a tube for carrying the liquid output from the reservoir 2211. The projecting portion 20 of the piezoelectric driving device 10 is provided in press contact with the side surface of the rotor 2222 and the piezoelectric driving device 10 rotationally drives the rotor 2222. The rotation force of the rotor 2222 is transmitted to the cam 2202 via the reduction transmission mechanism 2223. The fingers 2213 to 2219 are members for blocking the tube 2212. When the cam 2202 rotates, the fingers 2213 to 2219 are sequentially pushed outward in the radial direction by projecting portions 2202A of the cam 2202. The fingers 2213 to 2219 block the tube 2212 sequentially from the upstream side in the carrying direction (the reservoir 2212 side). Thereby, the liquid within the tube 2212 is sequentially carried to the downstream side. In this manner, the smaller liquid delivery pump 2200 that can deliver an extremely small amount of the liquid with higher accuracy may be implemented. Note that the arrangement of the respective members is not limited to the illustrated one. Further, without the members like fingers, a ball or the like provided on the rotor 2222 may block the tube 2212. The above described liquid delivery pump 2200 may be utilized for a chemical dosing apparatus for giving a medical solution such as insulin to a human body. Here, the piezoelectric driving device 10 of the above described embodiment is used, and thereby, drive currents are smaller than those in the piezoelectric driving device in related art, and power consumption of the chemical dosing apparatus may be suppressed. Therefore, the embodiment is particularly effective when the chemical dosing apparatus is driven using a battery.

MODIFIED EXAMPLES

The invention is not limited to the above described examples and embodiments, but can be embodied in various forms without departing from the scope of the invention. For example, the following modifications may be made.

Modified Example 1

In the above described embodiments, the first electrode 130, the piezoelectric body 140, and the second electrode 150 are formed on the substrate 120, however, the substrate 120 may be omitted and the first electrode 130, the piezoelectric body 140, and the second electrode 150 may be formed on the vibrating plate 200.

Modified Example 2

In the above described embodiments, the respective single piezoelectric vibrators 100 are provided on both surfaces of the vibrating plate 200, however, one of the piezoelectric vibrators 100 may be omitted. Note that it is preferable to respectively provide the piezoelectric vibrators 100 on both surfaces of the vibrating plate 200 because the vibrating plate 200 is deformed to bend in a meandering shape within the plane more easily.

As above, the embodiments of the invention are described based on the several examples. The above described embodiments of the invention facilitate understanding of the invention, not limit the invention. Changes and improvements may be made to the invention without departing from the spirit and the scope and the appended claims and, obviously, the invention includes their equivalents.

The entire disclosure of Japanese Patent Application Nos. 2014-164618, filed Aug. 13, 2014 and 2014-164619, filed Aug. 13, 2014 are expressly incorporated by reference herein.

What is claimed is:
1. A piezoelectric driving device comprising:
 a vibrating plate having first and second plate surfaces that are opposite to each other, the vibrating plate having a projection that outwardly extends from an end side surface of the vibrating plate in a first direction;

a first substrate that is bonded directly on the first plate surface of the vibrating plate;

a first piezoelectric vibrator that is disposed on the first substrate, the first piezoelectric vibrator having a first electrode, a second electrode, and a first piezoelectric body directly located between the first electrode and the second electrode, the first electrode being directly disposed on the first substrate;

a second substrate that is bonded directly on the second plate surface of the vibrating plate; and a second piezoelectric vibrator that is disposed on the second substrate, the second piezoelectric vibrator having a third electrode, a fourth electrode, and a second piezoelectric body located directly between the third electrode and the fourth electrode, the third electrode being disposed directly on the second substrate, wherein a thickness of each of the first and second piezoelectric bodies is within a range from 50 nm to 20 μm, and when a driving current is applied to the first, second, third, and fourth electrodes, the vibrating plate is caused to vibrate so that the projection moves in a second direction perpendicular to the first direction.

2. The piezoelectric driving device according to claim 1, wherein the thickness of each of the first and second piezoelectric bodies is within a range from 400 nm to 20 μm.

3. The piezoelectric driving device according to claim 1, wherein each of the first and second substrates is a silicon substrate.

4. The piezoelectric driving device according to claim 1, wherein the projection is configured to physically contact a driven member.

5. A robot comprising:
a plurality of link parts;
a plurality of joint parts connecting the plurality of link parts; and
a piezoelectric driving device including:
a vibrating plate having first and second plate surfaces that are opposite to each other, the vibrating plate having a projection that outwardly extends from an end side surface of the vibrating plate in a first direction;

a first substrate that is bonded directly on the first plate surface of the vibrating plate;

a first piezoelectric vibrator that is disposed on the first substrate, the first piezoelectric vibrator having a first electrode, a second electrode, and a first piezoelectric body located directly between the first electrode and the second electrode, the first electrode being disposed directly on the first substrate;

a second substrate that is bonded directly on the second plate surface of the vibrating plate; and a second piezoelectric vibrator that is disposed on the second substrate, the second piezoelectric vibrator having a third electrode, a fourth electrode, and a second piezoelectric body located directly between the third electrode and the fourth electrode, the third electrode being disposed directly on the second substrate, wherein a thickness of each of the first and second piezoelectric bodies is within a range from 50 nm to 20 μm, when a driving current is applied to the first, second, third, and fourth electrodes, the vibrating plate is vibrated so that the projection moves in a second direction perpendicular to the first direction, and wherein the piezoelectric driving device is configured to rotate one of the plurality of link parts.

6. The robot according to claim 5, wherein the thickness of each of the first and second piezoelectric bodies is within a range from 400 nm to 20 μm.

7. The robot according to claim 5, wherein each of the first and second substrates is a silicon substrate.

8. The robot according to claim 5, wherein the projection is configured to physically contact a driven member.

* * * * *